United States Patent
Dewey et al.

(10) Patent No.: US 9,018,680 B2
(45) Date of Patent: Apr. 28, 2015

(54) NON-PLANAR SEMICONDUCTOR DEVICE HAVING ACTIVE REGION WITH MULTI-DIELECTRIC GATE STACK

(71) Applicants: Gilbert Dewey, Hillsboro, OR (US); Marko Radosavljevic, Beaverton, OR (US); Ravi Pillarisetty, Portland, OR (US); Benjamin Chu-Kung, Hillsboro, OR (US); Niloy Mukherjee, Beaverton, OR (US)

(72) Inventors: Gilbert Dewey, Hillsboro, OR (US); Marko Radosavljevic, Beaverton, OR (US); Ravi Pillarisetty, Portland, OR (US); Benjamin Chu-Kung, Hillsboro, OR (US); Niloy Mukherjee, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/340,981

(22) Filed: Jul. 25, 2014

(65) Prior Publication Data
US 2014/0332852 A1 Nov. 13, 2014

Related U.S. Application Data

(63) Continuation of application No. 13/629,154, filed on Sep. 27, 2012, now Pat. No. 8,823,059.

(51) Int. Cl.
*H01L 29/66* (2006.01)
*H01L 29/40* (2006.01)
(Continued)

(52) U.S. Cl.
CPC ............... *H01L 29/408* (2013.01); *B82Y 99/00* (2013.01); *H01L 29/78* (2013.01); *B82Y 10/00* (2013.01);
(Continued)

(58) Field of Classification Search
CPC ...... B82Y 10/00; B82Y 99/00; H01L 29/775; H01L 29/0673; H01L 29/0665; H01L 29/513; H01L 29/78; H01L 29/205; H01L 29/408; H01L 29/4236
USPC .......................................... 257/192, 288, 330
See application file for complete search history.

(56) References Cited

U.S. PATENT DOCUMENTS

| | | | |
|---|---|---|---|
| 2003/0178617 | A1 | 9/2003 | Appenzeller et al. |
| 2006/0065927 | A1 | 3/2006 | Thean et al. |

(Continued)

FOREIGN PATENT DOCUMENTS

| | | |
|---|---|---|
| KR | 10-2005-0099324 | 10/2005 |
| KR | 100801063 | 2/2008 |

OTHER PUBLICATIONS

International Search Report and Written Opinion from PCT/US2013/045507 mailed Nov. 22, 2013, 12 pgs.

(Continued)

*Primary Examiner* — Nikolay Yushin
(74) *Attorney, Agent, or Firm* — Blakely, Sokoloff, Taylor & Zafman LLP

(57) ABSTRACT

Non-planar semiconductor devices having group III-V material active regions with multi-dielectric gate stacks are described. For example, a semiconductor device includes a hetero-structure disposed above a substrate. The hetero-structure includes a three-dimensional group III-V material body with a channel region. A source and drain material region is disposed above the three-dimensional group III-V material body. A trench is disposed in the source and drain material region separating a source region from a drain region, and exposing at least a portion of the channel region. A gate stack is disposed in the trench and on the exposed portion of the channel region. The gate stack includes first and second dielectric layers and a gate electrode.

22 Claims, 8 Drawing Sheets

(51) Int. Cl.
*H01L 29/78* (2006.01)
*B82Y 10/00* (2011.01)
*H01L 29/775* (2006.01)
*H01L 29/06* (2006.01)
*H01L 29/205* (2006.01)
*H01L 29/423* (2006.01)
*H01L 29/51* (2006.01)
*H01L 29/786* (2006.01)
*B82Y 99/00* (2011.01)

(52) U.S. Cl.
CPC .......... *H01L 29/775* (2013.01); *H01L 29/0673* (2013.01); *H01L 29/0665* (2013.01); *H01L 29/205* (2013.01); *H01L 29/4236* (2013.01); *H01L 29/513* (2013.01); *H01L 29/42392* (2013.01); *H01L 29/785* (2013.01); *H01L 29/78696* (2013.01)

(56) References Cited

U.S. PATENT DOCUMENTS

| | | |
|---|---|---|
| 2007/0072335 A1 | 3/2007 | Baik et al. |
| 2008/0242075 A1 | 10/2008 | Oh et al. |
| 2010/0068862 A1 | 3/2010 | Lee et al. |
| 2010/0213441 A1 | 8/2010 | Pillarisetty et al. |
| 2011/0291190 A1 | 12/2011 | Xiao et al. |

OTHER PUBLICATIONS

Robertson, J., "High Dielectric Constant Oxides," Eur. Phys. J. Appl. Phys. vol. 28 (2004) pp. 265-291.

Non-Final Office Action from U.S. Appl. No. 13/629,154 mailed Jul. 31, 2013, 21 pgs.

Non-Final Office Action (*Ex parte Quayle*) from U.S. Appl. No. 13/629,154 mailed Jan. 7, 2014, 9 pgs.

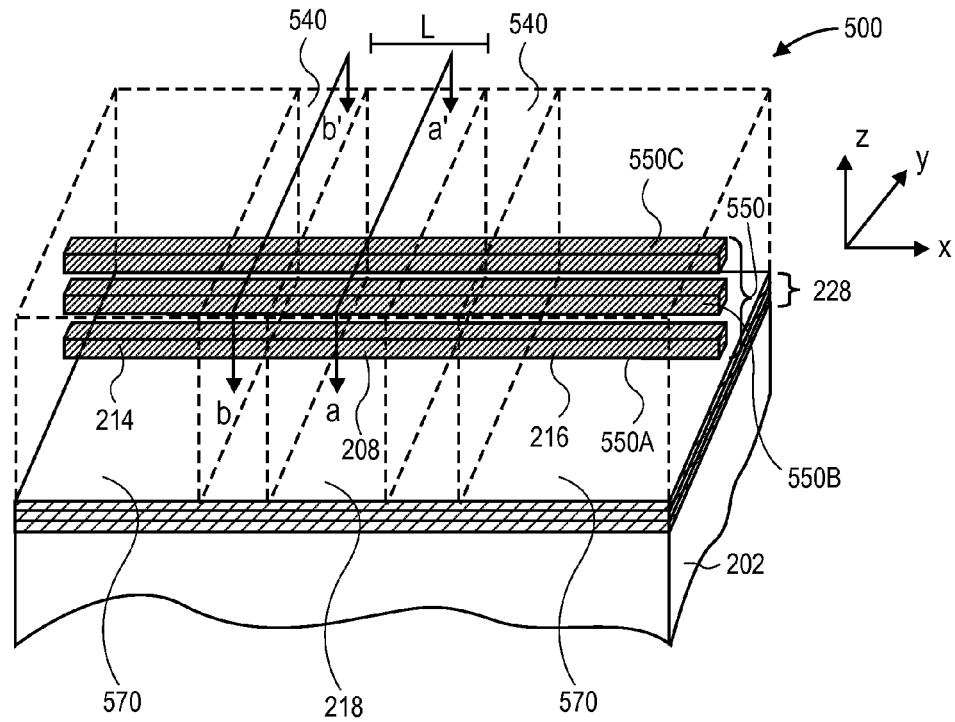
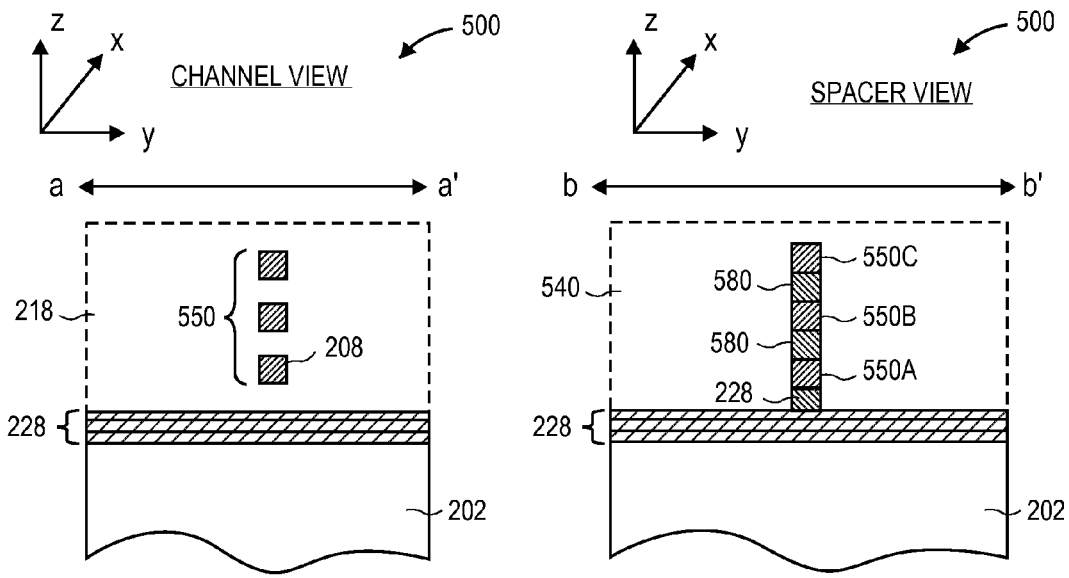
FIG. 5A
FIG. 5B
FIG. 5C

NON-PLANAR SEMICONDUCTOR DEVICE HAVING ACTIVE REGION WITH MULTI-DIELECTRIC GATE STACK

CROSS-REFERENCE TO RELATED APPLICATIONS

This application is a continuation of U.S. patent application Ser. No. 13/629,154, filed on Sep. 27, 2012, the entire contents of which are hereby incorporated by reference herein.

TECHNICAL FIELD

Embodiments of the invention are in the field of semiconductor devices and, in particular, non-planar semiconductor devices having group III-V material active regions with multi-dielectric gate stacks.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Semiconductor devices formed in epitaxially grown semiconductor hetero-structures, such as in group III-V material systems, offer exceptionally high carrier mobility in the transistor channels due to low effective mass along with reduced impurity scattering. Such devices provide high drive current performance and appear promising for future low power, high speed logic applications. However, significant improvements are still needed in the area of group III-V material-based devices.

Additionally, in the manufacture of integrated circuit devices, multi-gate transistors, such as tri-gate transistors, have become more prevalent as device dimensions continue to scale down. Many different techniques have been attempted to reduce junction leakage of such transistors. However, significant improvements are still needed in the area of junction leakage suppression.

BRIEF DESCRIPTION OF THE DRAWINGS

FIG. 5A illustrates a three-dimensional cross-sectional view of a nanowire-based semiconductor structure, in accordance with an embodiment of the present invention.

FIG. 5B illustrates a cross-sectional channel view of the nanowire-based semiconductor structure of FIG. 5A, as taken along the a-a' axis, in accordance with an embodiment of the present invention.

FIG. 5C illustrates a cross-sectional spacer view of the nanowire-based semiconductor structure of FIG. 5A, as taken along the b-b' axis, in accordance with an embodiment of the present invention.

DESCRIPTION OF THE EMBODIMENTS

Non-planar semiconductor devices having group III-V material active regions with multi-dielectric gate stacks are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to non-planar semiconductor devices having group III-V material active regions with multi-dielectric gate stacks. In particular, dual oxide/passivation features for group III-V material non-planar transistors are described. Embodiments may cover approaches for fabricating devices having one or more of a dual oxide, a III-V channel, low off-state leakage, and may be applicable to transistors based on non-silicon channel configurations.

With respect to providing a context for one or more embodiments described herein, past architectures for related devices may include or invoke a leakage path in a III-V material based transistor. The leakage path may be below the gate electrode and through a larger band-gap bottom barrier since the larger band-gap material is in contact with a high-k gate dielectric and may not be compatible with such a dielectric. Such contact with a high-k gate dielectric may result in an large density of interface traps and allow for a conduction path outside of the gate control of the device, thereby limiting the off-state leakage of the III-V transistor. Such issues may be enhanced in non-planar transistor structures.

Figure 1A:
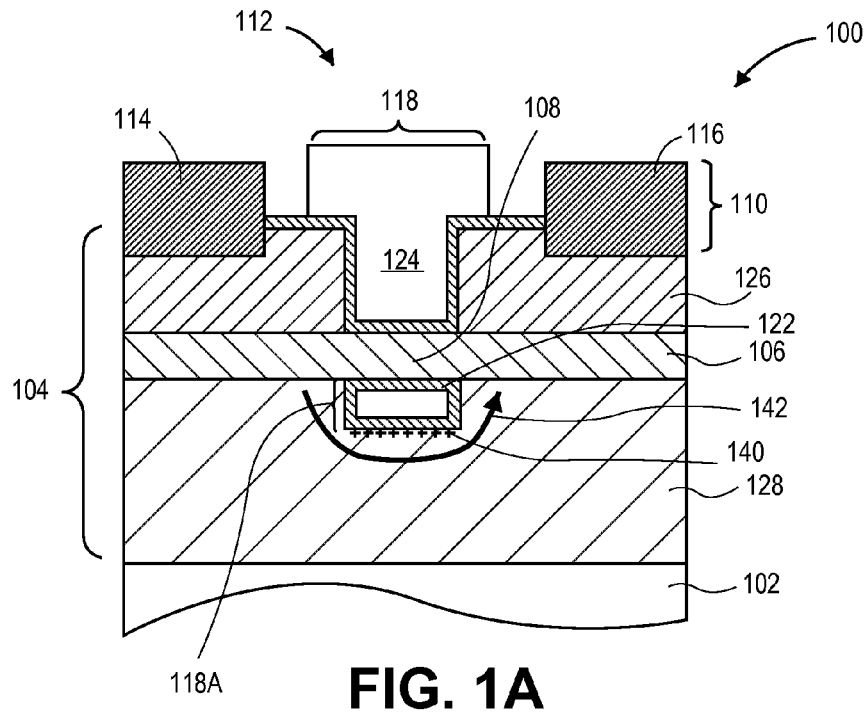
FIG. 1A illustrates a cross-sectional view of a non-planar semiconductor device having group III-V material active region with a single-dielectric gate stack.

As an example of a conventional approach, FIG. 1A illustrates a cross-sectional view of a non-planar semiconductor device having group III-V material active region with a single-dielectric gate stack. Referring to FIG. 1A, a semiconductor device 100 includes a hetero-structure 104 disposed above a substrate 102. The hetero-structure 104 includes a three-dimensional group III-V material body 106 with a channel region 108. A source and drain material region 110 is disposed above the three-dimensional group III-V material body 106. A trench 112 having is disposed in the source and drain material region 110, separating a source region 114 from a drain region 116, and exposing at least a portion of the channel region 108. A gate stack 118 is disposed in the trench 112 and on the exposed portion of the channel region 108. The gate stack 118 includes a high-k gate dielectric layer 122 and a gate electrode 124. It is to be understood that the gate stack 118 includes a portion below the channel region, labeled 118A in FIG. 1A. The hetero-structure 104 further includes a top barrier layer 126 and a bottom barrier layer 128. The trench 112 is further disposed in the top barrier layer 126 and partially into bottom barrier layer 128. As such, the gate stack 118 may completely surround the channel region 108, as depicted in FIG. 1A.

Figure 1B:
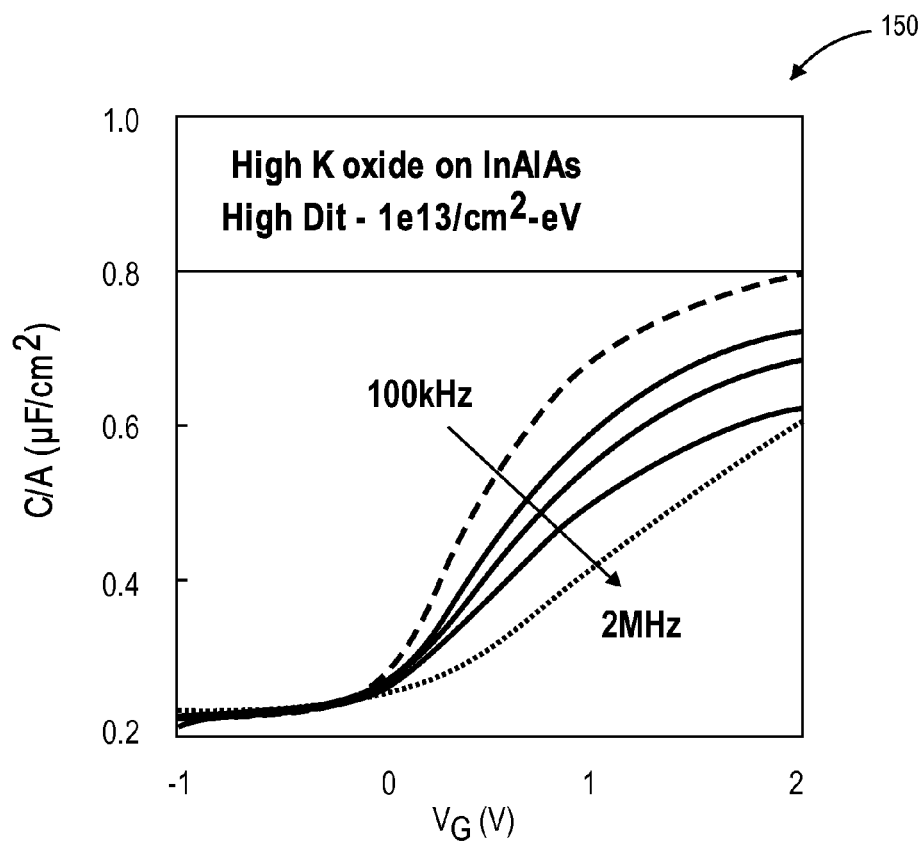
FIG. 1B is a plot of C/A as a function of $V_G$ for the device of FIG. 1A over a spectrum of 100 kHz to 2 MHz.

Referring again to FIG. 1A, the high-k gate dielectric layer 122 is in contact with a high band-gap bottom barrier layer 128 (e.g., InAlAs). Interface states 140 may thus be generated and result in an unwanted leakage path 142 from source 114 to drain 116. Such a leakage path 142 may detrimentally increase the off-state leakage of the device 100. Furthermore, providing such a thin and high capacitance gate dielectric as a spacer also results in high parasitic capacitance and may result in slower transistor operation in circuits (e.g., poor RF performance). As an example, FIG. 1B is a plot 150 of C/A as a function of $V_G$ for device 100 over a spectrum of 100 kHz to 2 MHz. As shown in plot 150, a high Dit is observed for current state of the art devices.

In order to address the above issues, one or more embodiments described herein are directed to approaches for, and the resulting devices, introducing a dual oxide/passivation layer into a non-planar III-V semiconductor device. Such a dual oxide/passivation layer may be included to reduce interface state generation below the transistor channel. In one embodiment, and outer oxide layer has a low dielectric constant so if it is thin, it can be used both in the gate stack or also as a spacer oxide. In an embodiment, inclusion of such a stack results in less Dit, reduces the parasitic drain off-state leakage, and lowers parasitic capacitance. Furthermore, improvements in mobility in the channel may be realized because of reduced scattering.

Figure 2:
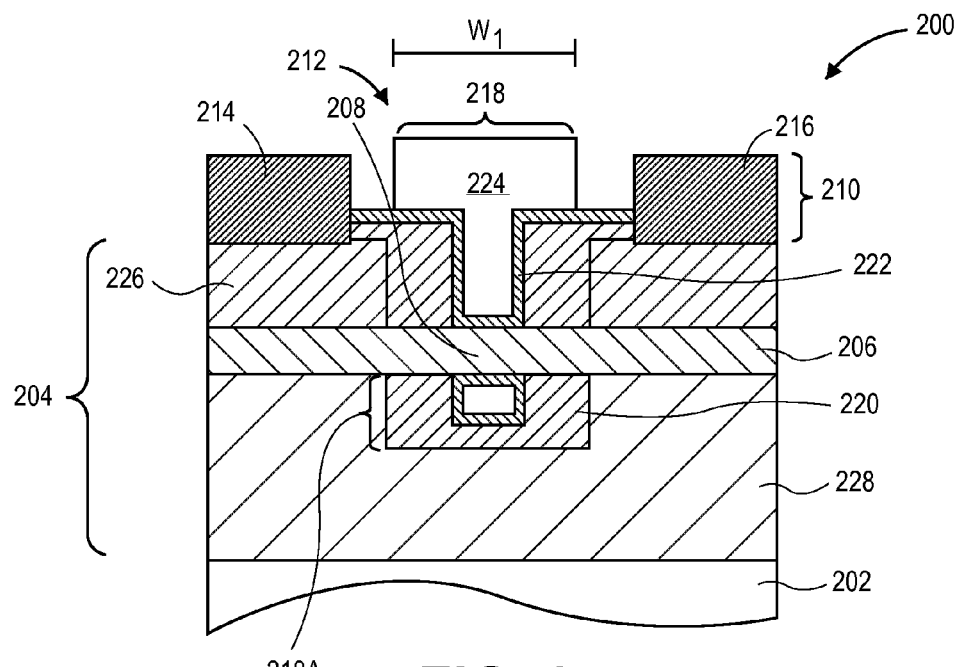
FIG. 2 illustrates a cross-sectional view of a non-planar semiconductor device having a group III-V material active region with a multi-dielectric gate stack, in accordance with an embodiment of the present invention.

In a first example, FIG. 2 illustrates a cross-sectional view of a non-planar semiconductor device having a group III-V material active region with a multi-dielectric gate stack, in accordance with an embodiment of the present invention.

Referring to FIG. 2, a semiconductor device 200 includes a hetero-structure 204 disposed above a substrate 202. The hetero-structure 204 includes a three-dimensional group III-V material body 206 with a channel region 208. A source and drain material region 210 is disposed above the three-dimensional group III-V material body 206. A trench 212 having a width W1 is disposed in the source and drain material region 210, separating a source region 214 from a drain region 216, and exposing at least a portion of the channel region 208. A gate stack 218 is disposed in the trench 212 and on the exposed portion of the channel region 208.

The gate stack 218 includes a first dielectric layer 220 conformal with the trench 212 and disposed on outer portions, but not an inner portion, of the channel region 208, as depicted in FIG. 2. A second, different, dielectric layer 222 is conformal with the first dielectric layer 220 and is disposed on the inner portion of the channel region 208, as is also depicted in FIG. 2. A gate electrode 224 is disposed on the second dielectric layer 222. Although depicted as T-shaped, gate electrode 224 may instead have the T-portions in order to reduce capacitance effects. In an embodiment, the first dielectric layer 220 has a thickness approximately in the range of 2-15 nanometers, and the second dielectric layer 222 has a thickness approximately in the range of 0.5-3 nanometers. In one such embodiment, the trench 212 has a width (W1) approximately in the range of 15-60 nanometers. It is to be understood that the gate stack 218 includes a portion below the channel region, labeled 218A in FIG. 2.

Referring again to FIG. 2, in an embodiment, the hetero-structure 204 further includes a top barrier layer 226 disposed between the source and drain material region 210 and the three-dimensional group III-V material body 206. The trench 212 is also disposed in the top barrier layer 226. In an embodiment, the hetero-structure 204 further includes a bottom barrier layer 228 disposed between the substrate 202 and the three-dimensional group III-V material body 206. In one such embodiment, the trench 212 is also partially disposed in the bottom barrier layer 228, completely exposing the channel region 208. In that embodiment, the gate stack 218 completely surrounds the channel region 208, as indicated in FIG. 2.

In a second example, both dielectric layers may be included in a stack covering all of the exposed channel. For example, FIG. 3 illustrates a cross-sectional view of another non-planar semiconductor device having a group III-V material active region with a multi-dielectric gate stack, in accordance with another embodiment of the present invention.

Figure 3:
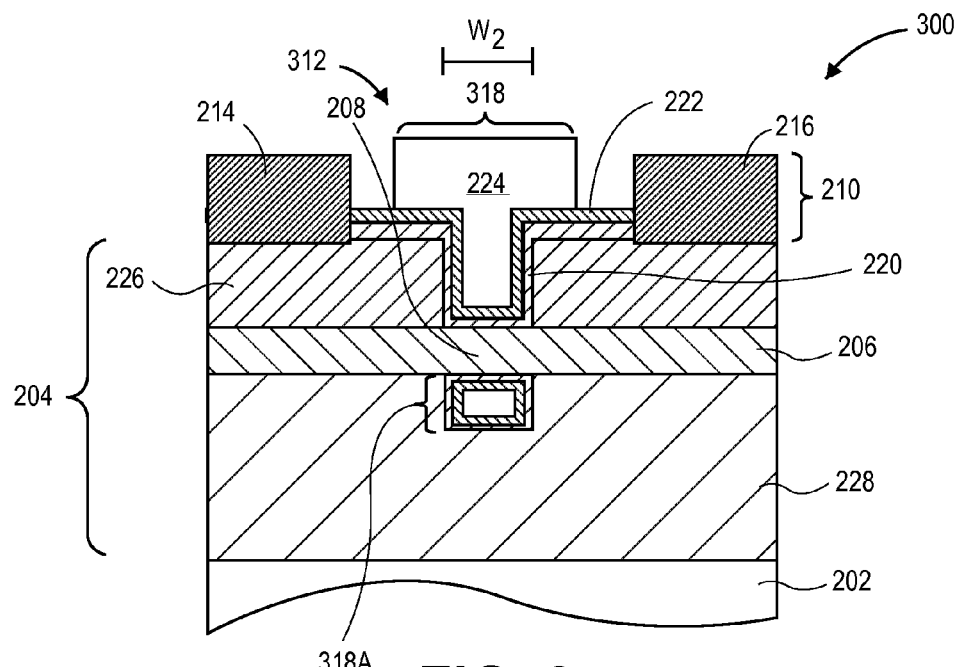
FIG. 3 illustrates a cross-sectional view of another non-planar semiconductor device having a group III-V material active region with a multi-dielectric gate stack, in accordance with another embodiment of the present invention.

Referring to FIG. 3, a semiconductor device 300 includes a hetero-structure 204 disposed above a substrate 202. The hetero-structure 204 includes a three-dimensional group III-V material body 206 with a channel region 208. A source and drain material region 210 is disposed above the three-dimensional group III-V material body 206. A trench 312 having a width W2 is disposed in the source and drain material region 210, separating a source region 214 from a drain region 216, and exposing at least a portion of the channel region 208. A gate stack 318 is disposed in the trench 312 and on the exposed portion of the channel region 208. It is to be understood that the gate stack 318 includes a portion below the channel region, labeled 318A in FIG. 3.

The gate stack 218 includes a first dielectric layer 220 conformal with the trench 312 and disposed on the exposed portion of the channel region 208. A second, different, dielectric layer 222 is conformal with and disposed on the first dielectric layer 220, but not directly on the channel region 208. A gate electrode 224 is disposed on the second dielectric layer 222. Although depicted as T-shaped, gate electrode 224 may instead have the T-portions in order to reduce capacitance effects. In an embodiment, the first dielectric layer 220 has a thickness approximately in the range of 0.3-2 nanometers, and the second dielectric layer 222 has a thickness approximately in the range of 0.5-3 nanometers. In one such embodiment, the trench 312 has a width (W2) approximately in the range of 5-25 nanometers.

Referring again to FIG. 2, in an embodiment, the hetero-structure 204 further includes a top barrier layer 226 disposed between the source and drain material region 210 and the three-dimensional group III-V material body 206. The trench 312 is also disposed in the top barrier layer 226. In an embodiment, the hetero-structure 204 further includes a bottom barrier layer 228 disposed between the substrate 202 and the three-dimensional group III-V material body 206. In one such embodiment, the trench 312 is also partially disposed in the bottom barrier layer 228, completely exposing the channel region 208. In that embodiment, the gate stack 318 completely surrounds the channel region 208, as indicated in FIG. 3. It is also to be understood that like feature designations of FIG. 3 may be as described in association with FIG. 2.

Referring to FIGS. 2 and 3, in an embodiment, the second dielectric layer 222 has a higher dielectric constant than the first dielectric layer 220. In one such embodiment, the second dielectric layer 222 has a dielectric constant greater than approximately 8 and the first dielectric layer 220 has a dielectric constant approximately in the range of 4-8. In another such embodiment, the second dielectric layer 222 is composed of a material such as, but not limited to, tantalum silicon oxide ($TaSiO_x$), aluminum oxide ($AlO_x$, with a dielectric constant of approximately 8), hafnium oxide ($HfO_2$, with a dielectric constant greater than 8), zirconium oxide ($ZrO_2$, with a dielectric constant greater than 8), and lanthanum oxide ($La_2O_3$, with a dielectric constant greater than 8). The first dielectric layer is composed of a material such as, but not limited to, aluminum silicate ($AlSiO_x$, with a dielectric constant of approximately 6, where varying the Si content in the $AlSiO_x$ can move the dielectric constant higher, e.g., up to 7), silicon oxynitride (SiON, with a dielectric constant approximately 5.5), silicon dioxide ($SiO_2$, with a dielectric constant of approximately 4) and silicon nitride ($Si_3N_4$, with a dielectric constant approximately in the range of 6-7). In an embodiment, gate electrode 224 is composed of a material such as, but not limited to, a metal nitride, a metal carbide, a metal silicide, hafnium, zirconium, titanium, tantalum, aluminum, ruthenium, palladium, platinum, cobalt or nickel. The gate electrode stack 218 may also include dielectric spacers, not depicted.

Substrate 202 may be composed of a material suitable for semiconductor device fabrication. In one embodiment, substrate 202 is a bulk substrate composed of a single crystal of a material which may include, but is not limited to, silicon, germanium, silicon-germanium or a III-V compound semiconductor material. In another embodiment, substrate 202 includes a bulk layer with a top epitaxial layer. In a specific embodiment, the bulk layer is composed of a single crystal of a material which may include, but is not limited to, silicon, germanium, silicon-germanium, a III-V compound semiconductor material or quartz, while the top epitaxial layer is composed of a single crystal layer which may include, but is not limited to, silicon, germanium, silicon-germanium or a III-V compound semiconductor material. In another embodiment, substrate 202 includes a top epitaxial layer on a middle insulator layer which is above a lower bulk layer. The top epitaxial layer is composed of a single crystal layer which may include, but is not limited to, silicon (e.g., to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxy-nitride. The lower bulk layer is composed of a single crystal which may include, but is not limited to, silicon, germanium, silicon-germanium, a III-V compound semiconductor material or quartz. Substrate 202 may further include dopant impurity atoms.

Hetero-structure 204 include a stack of one or more crystalline semiconductor layers, such as a compositional buffer layer (not shown) with the bottom barrier layer 228 disposed thereon. The compositional buffer layer may be composed of a crystalline material suitable to provide a specific lattice structure onto which a bottom barrier layer may be formed with negligible dislocations. For example, in accordance with an embodiment of the present invention, the compositional buffer layer is used to change, by a gradient of lattice constants, the exposed growth surface of semiconductor hetero-structure 204 from the lattice structure of substrate 202 to one that is more compatible for epitaxial growth of high quality, low defect layers thereon. In one embodiment, the compositional buffer layer acts to provide a more suitable lattice constant for epitaxial growth instead of an incompatible lattice constant of substrate 202. In an embodiment, substrate 202 is composed of single-crystal silicon and the compositional buffer layer grades to a bottom barrier layer composed of a layer of InAlAs having a thickness of approximately 1 micron. In an alternative embodiment, the compositional buffer layer is omitted because the lattice constant of substrate 202 is suitable for the growth of a bottom barrier layer 228 for a quantum-well semiconductor device.

The bottom barrier layer 228 may be composed of a material suitable to confine a wave-function in a quantum-well formed thereon. In accordance with an embodiment of the present invention, the bottom barrier layer 228 has a lattice constant suitably matched to the top lattice constant of the compositional buffer layer, e.g., the lattice constants are similar enough that dislocation formation in the bottom barrier layer 228 is negligible. In one embodiment, the bottom barrier layer 228 is composed of a layer of approximately $In_{0.65}Al_{0.35}As$ having a thickness of approximately 10 nanometers. In a specific embodiment, the bottom barrier layer 228 composed of the layer of approximately $In_{0.65}Al_{0.35}As$ is used for quantum confinement in an N-type semiconductor device. In another embodiment, the bottom barrier layer 228 is composed of a layer of approximately $In_{0.65}Al_{0.35}Sb$ having a thickness of approximately 10 nanometers. In a specific embodiment, the bottom barrier layer 228 composed of the layer of approximately $In_{0.65}Al_{0.35}Sb$ is used for quantum confinement in a P-type semiconductor device.

The three-dimensional group III-V material body 206 may be composed of a material suitable to propagate a wave-function with low resistance. In accordance with an embodiment of the present invention, three-dimensional group III-V material body 206 has a lattice constant suitably matched to the lattice constant of the bottom barrier layer 228 of hetero-structure 204, e.g., the lattice constants are similar enough that dislocation formation in three-dimensional group III-V material body 206 is negligible. In an embodiment, three-dimensional group III-V material body 206 is composed of groups III (e.g. boron, aluminum, gallium or indium) and V (e.g. nitrogen, phosphorous, arsenic or antimony) elements. In one embodiment, three-dimensional group III-V material body 206 is composed of InAs or InSb. The three-dimensional group III-V material body 206 may have a thickness suitable to propagate a substantial portion of a wave-function, e.g. suitable to inhibit a significant portion of the wave-function from entering the bottom barrier layer 228 of hetero-structure 204 or a top barrier layer (e.g., barrier layer 226) formed on three-dimensional group III-V material body 206. In an embodiment, three-dimensional group III-V material body 206 has a thickness (height) approximately in the range of 50-100 Angstroms. The width (dimension taken into the page as shown) may have approximately the same dimension, providing a three-dimensional wire-type feature.

Top barrier layer 226 may be composed of a material suitable to confine a wave-function in a III-V material body/channel region formed there under. In accordance with an embodiment of the present invention, top barrier layer 226 has a lattice constant suitably matched to the lattice constant of channel region 206, e.g., the lattice constants are similar enough that dislocation formation in top barrier layer 226 is negligible. In one embodiment, top barrier layer 226 is composed of a layer of material such as, but not limited to, N-type InGaAs. Source and drain material region 210 may be doped group III-V material region, such a more heavily doped structure formed from the same or similar material as top barrier layer 226. In other embodiments, the composition of source and drain material region 210, aside from doping differences, differs from the material of top barrier layer 226.

Semiconductor device 200 or 300 may be a semiconductor device incorporating a gate, a channel region and a pair of source/drain regions. In an embodiment, semiconductor device 200 or 300 is one such as, but not limited to, a MOS-FET or a Microelectromechanical System (MEMS). In one embodiment, semiconductor device 200 or 300 is a planar or three-dimensional MOS-FET and is an isolated device or is one device in a plurality of nested devices. As will be appreciated for a typical integrated circuit, both N- and P-channel transistors may be fabricated on a single substrate to form a CMOS integrated circuit. Furthermore, additional interconnect wiring may be fabricated in order to integrate such devices into an integrated circuit.

The above described devices can be viewed as trench-based devices, where a gate wraps a channel region within a trench of a stack of III-V material layers. However, other devices may include a protruding III-V channel regions, such as in a tri-gate or FIN-FET based MOS-FETs. For example, FIG. 4 illustrates an angled view of a non-planar semiconductor device having a group III-V material active region with a multi-dielectric gate stack, in accordance with an embodiment of the present invention.

Figure 4:
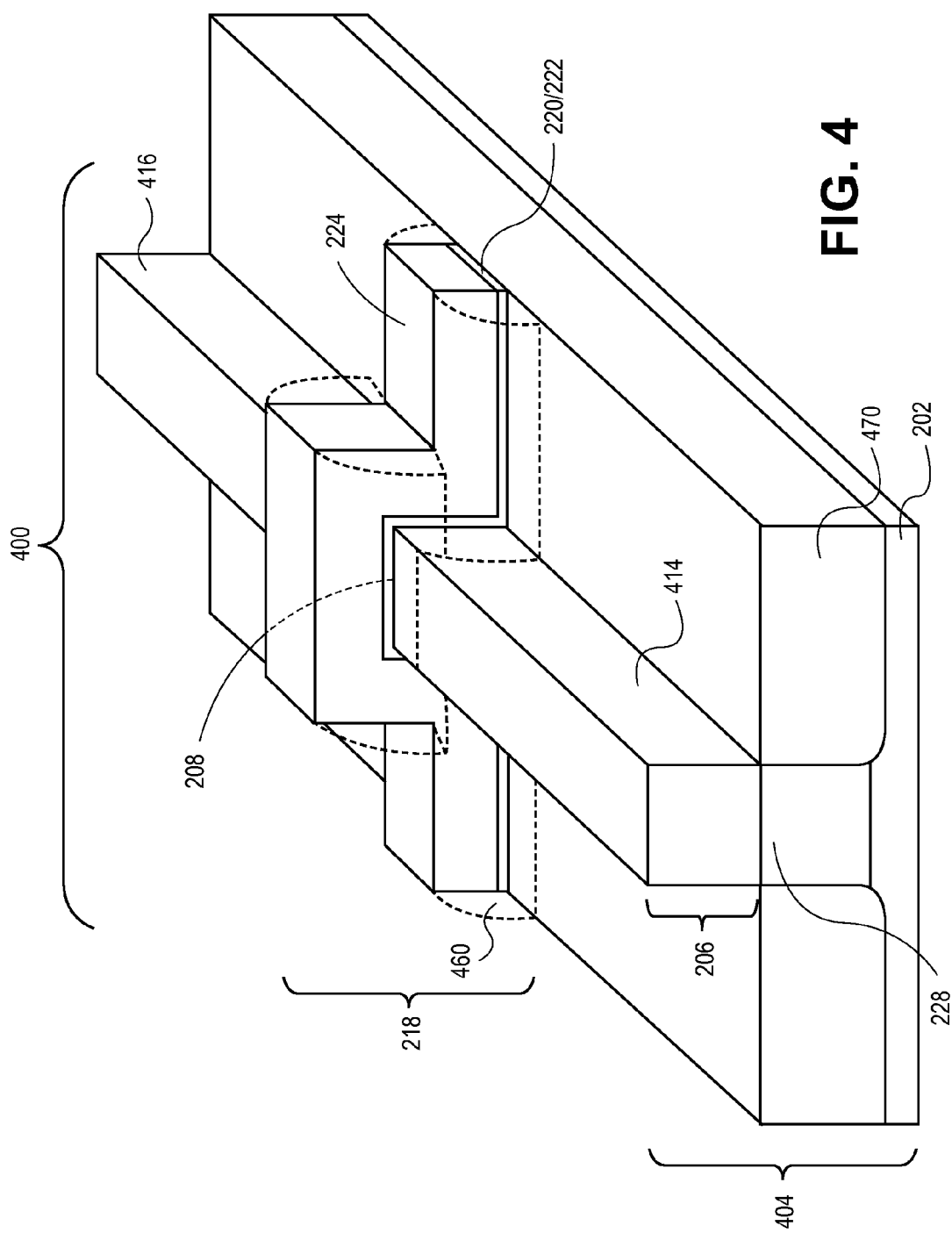
FIG. 4 illustrates an angled view of a non-planar semiconductor device having a group III-V material active region with a multi-dielectric gate stack, in accordance with an embodiment of the present invention.

Referring to FIG. 4, a semiconductor device 400 includes a hetero-structure 404 disposed above a substrate 202. The hetero-structure 404 includes a bottom barrier layer 228. A three-dimensional group III-V material body 206 with a channel region 208 is disposed above the bottom barrier layer 228. A gate stack 218 is disposed to surround at least a portion of the channel region 208. In an embodiment, not viewable from the perspective of FIG. 4, the gate stack completely surrounds the channel region 208. The gate stack 218 includes a gate electrode 224 and a dual gate dielectric layer 220/222, such as the dual date dielectric layers described in association with FIGS. 2 and 3. The gate stack may further include dielectric spacers 460.

Source and drain regions 414/416 may be formed in or on portions of the three-dimensional group III-V material body 206 not surrounded by gate stack 218. Furthermore, a top barrier layer may be included in those regions as well. Also, isolation regions 470 may be included. Although depicted in FIG. 4 as being somewhat aligned with the bottom of the bottom barrier layer 228, it is to be understood that the depth of the isolation regions 470 may vary. Also, although depicted in FIG. 4 as being somewhat aligned with the top of the bottom barrier layer 228, it is to be understood that the height of the isolation regions 470 may vary. It is also to be understood that like feature designations of FIG. 4 may be as described in association with FIG. 2.

In another aspect, FIG. 5A illustrates a three-dimensional cross-sectional view of a group III-V material nanowire-based semiconductor structure, in accordance with an embodiment of the present invention. FIG. 5B illustrates a cross-sectional channel view of the group III-V material nanowire-based semiconductor structure of FIG. 5A, as taken along the a-a' axis. FIG. 5C illustrates a cross-sectional spacer view of the group III-V material nanowire-based semiconductor structure of FIG. 5A, as taken along the b-b' axis.

Referring to FIG. 5A, a semiconductor device 500 includes one or more vertically stacked group III-V material nanowires (550 set) disposed above a substrate 202. Embodiments herein are targeted at both single wire devices and multiple wire devices. As an example, a three nanowire-based devices having nanowires 550A, 550B and 550C is shown for illustrative purposes. For convenience of description, nanowire 550A is used as an example where description is focused on only one of the nanowires. It is to be understood that where attributes of one nanowire are described, embodiments based on a plurality of nanowires may have the same attributes for each of the nanowires.

At least the first nanowire 550A includes a group III-V material channel region 208. The group III-V material channel region 208 has a length (L). Referring to FIG. 5B, the group III-V material channel region 208 also has a perimeter orthogonal to the length (L). Referring to both FIGS. 5A and 5B, a gate electrode stack 218 surrounds the entire perimeter of each of the channel regions of each nanowire 550, including group III-V material channel region 208. The gate electrode stack 218 includes a gate electrode along with a gate dielectric layer disposed between the channel regions and the gate electrode (not individually shown). The group III-V material channel region 208 and the channel regions of the additional nanowires 550B and 550C are discrete in that they are completely surrounded by the gate electrode stack 218 without any intervening material such as underlying substrate material or overlying channel fabrication materials. Accordingly, in embodiments having a plurality of nanowires 550, the channel regions of the nanowires are also discrete relative to one another, as depicted in FIG. 5B. Referring to FIGS. 5A-5C, a bottom barrier layer 228 is disposed above substrate 202. The bottom barrier layer 228 is further disposed below the one or more nanowires 550. In an embodiment, the group III-V material channel region 208 is completely surrounded by gate electrode 218, as depicted in FIG. 5B.

Referring again to FIG. 5A, each of the nanowires 550 also includes source and drain regions 214 and 216 disposed in or on the nanowire on either side of the channel regions, including on either side of group III-V material channel region 208. In an embodiment, the source and drain regions 214/216 are embedded source and drain regions, e.g., at least a portion of the nanowires is removed and replaced with a source/drain material region. However, in another embodiment, the source and drain regions 214/216 are composed of, or at least include, portions of the one or more nanowires 550.

A pair of contacts 570 is disposed over the source/drain regions 214/216. In an embodiment, the semiconductor device 500 further includes a pair of spacers 540. The spacers 540 are disposed between the gate electrode stack 218 and the pair of contacts 570. As described above, the channel regions and the source/drain regions are, in at least several embodiments, made to be discrete. However, not all regions of the nanowires 550 need be, or even can be made to be discrete. For example, referring to FIG. 5C, nanowires 550A-550C are not discrete at the location under spacers 540. In one embodiment, the stack of nanowires 550A-550C have intervening semiconductor material 580 there between. In one embodiment, the bottom nanowire 550A is still in contact with a portion of the bottom buffer layer 228, which is otherwise recessed for gate stack 218 formation (FIG. 5B). Thus, in an embodiment, a portion of the plurality of vertically stacked nanowires 550 under one or both of the spacers 540 is non-discrete.

It is to be understood that like feature designations of FIG. 5A-5C may be as described in association with FIG. 2. Also, although the device 500 described above is for a single device, a CMOS architecture may also be formed to include both NMOS and PMOS nanowire-based devices disposed on or above the same substrate. In an embodiment, the nanowires 550 may be sized as wires or ribbons, and may have squared-off or rounded corners.

In an embodiment, gate stack 218 is formed in a wide trench formed around nanowires 550. In one such embodiment, the gate stack includes a first dielectric layer disposed on outer portions, but not an inner portion, of each of the channel regions. A second, different, dielectric layer is conformal with the first dielectric layer and disposed on the inner portion of each of the channel regions. A gate electrode is disposed on the second dielectric layer. In a specific such embodiment, the first dielectric layer has a thickness approximately in the range of 2-15 nanometers, and the second dielectric layer has a thickness approximately in the range of 0.5-3 nanometers.

In another embodiment, gate stack 218 is formed in a narrow trench formed around nanowires 550. In one such embodiment, the gate stack includes a first dielectric layer disposed on each of the channel regions. A second, different, dielectric layer is conformal with the first dielectric layer and is disposed on the first dielectric layer, but not on each of the channel regions. A gate electrode is disposed on the second dielectric layer. In a specific such embodiment, the first dielectric layer has a thickness approximately in the range of 0.3-2 nanometers, and the second dielectric layer has a thickness approximately in the range of 0.5-3 nanometers.

Figure 5D:
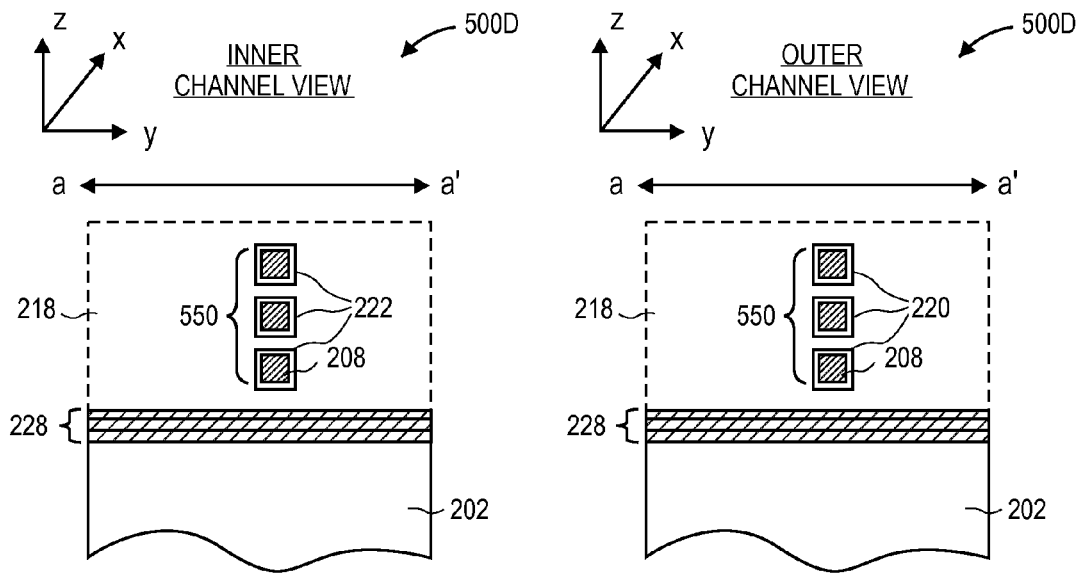
FIG. 5D illustrates a cross-sectional inner channel view and a cross-sectional outer channel view of the nanowire-based semiconductor structure of FIG. 5A, corresponding to the gate stack embodiment described in association with FIG. 2, in accordance with an embodiment of the present invention.

FIG. 5D illustrates a cross-sectional inner channel view and a cross-sectional outer channel view of the nanowire-based semiconductor structure 500D of FIG. 5A, corresponding to the gate stack embodiment described in association with FIG. 2, in accordance with an embodiment of the present invention.

Figure 5E:
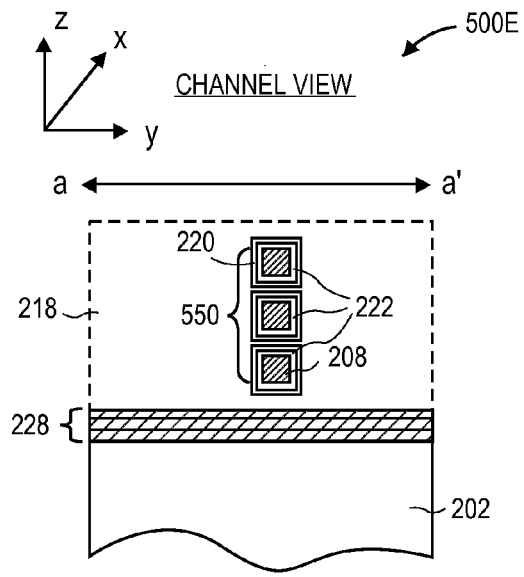
FIG. 5E illustrates a cross-sectional channel view of the nanowire-based semiconductor structure of FIG. 5A, corresponding to the gate stack embodiment described in association with FIG. 3, in accordance with an embodiment of the present invention.

FIG. 5E illustrates a cross-sectional channel view of the nanowire-based semiconductor structure 500E of FIG. 5A, corresponding to the gate stack embodiment described in association with FIG. 3, in accordance with an embodiment of the present invention.

In another aspect, methods of fabricating a group III-V material-based semiconductor structure are provided. For example, FIGS. 6A-6E illustrate cross-sectional views representing various operations in a method of fabricating a non-planar semiconductor device having a group III-V material active region with a multi-dielectric gate stack, in accordance with an embodiment of the present invention. It is also to be understood that like feature designations of FIGS. 6A-6E may be as described in association with FIGS. 2 and 3.

Figure 6A:
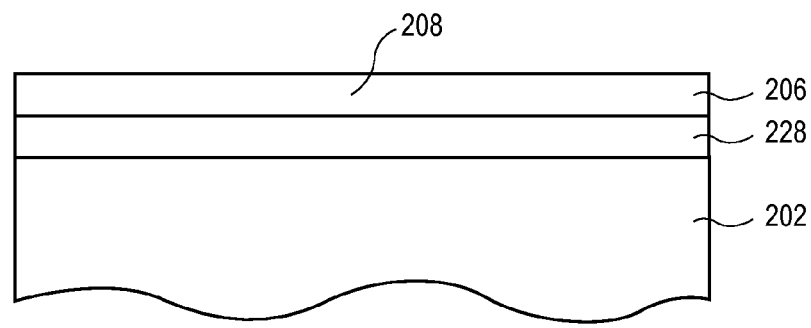
FIGS. 6A-6E illustrate cross-sectional views representing various operations in a method of fabricating a non-planar semiconductor device having a group III-V material active region with a multi-dielectric gate stack, in accordance with an embodiment of the present invention.

Referring to FIG. 6A, a bottom barrier layer 228 is formed above a substrate 202. A III-V material layer is then formed on bottom barrier layer 228 and patterned to form three-dimensional material body 206 with channel region 208. Alternatively, the III-V material layer may be formed after or during the trench formation described in association with FIG. 6C.

Figure 6B:
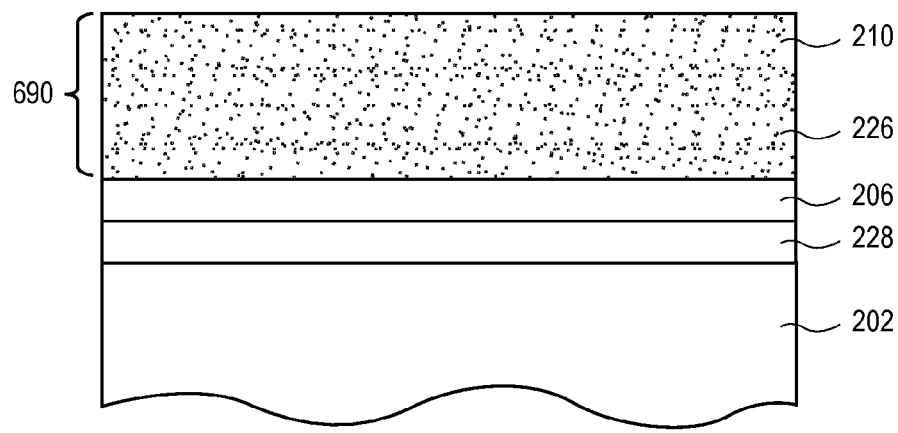

Referring to FIG. 6B, a hetero-structure 690, which may include a top barrier layer 226 and source and drain material region 210, is formed above the three-dimensional material body 206 (or above the III-V material layer, if not yet patterned).

Figure 6C:
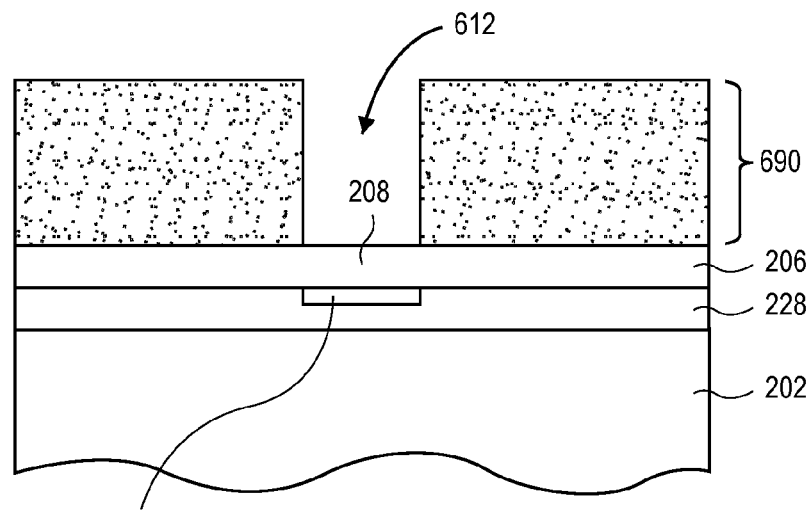

Referring to FIG. 6C, a trench 612 is formed in hetero-structure 690 and partially into bottom barrier layer 228, exposing channel region 208. In an embodiment, trench 612 is formed by a dry or wet etch process.

Figure 6D:
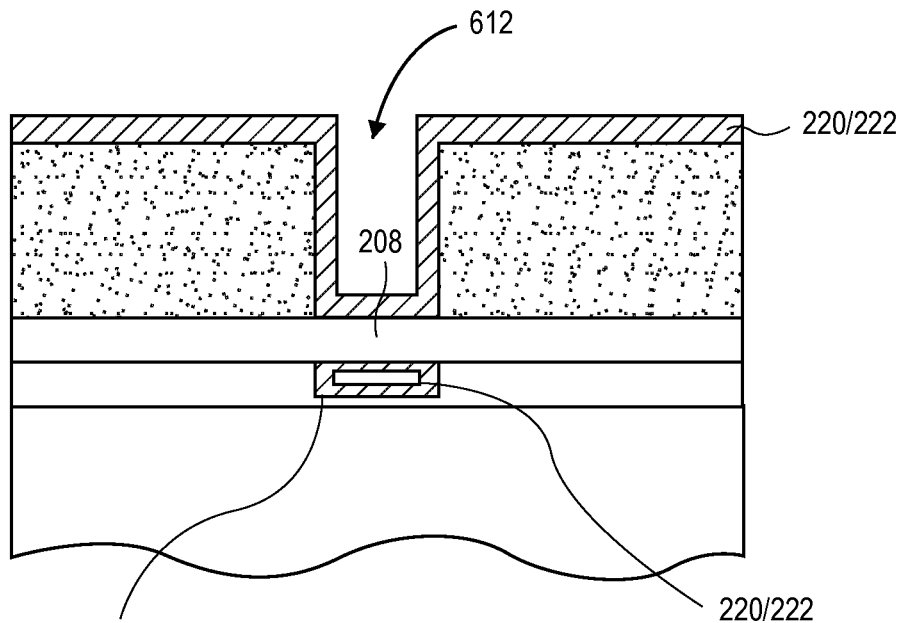

Referring to FIG. 6D, a dual dielectric stack 220/222 is formed in trench 612 and surrounding channel region 208.

Figure 6E:
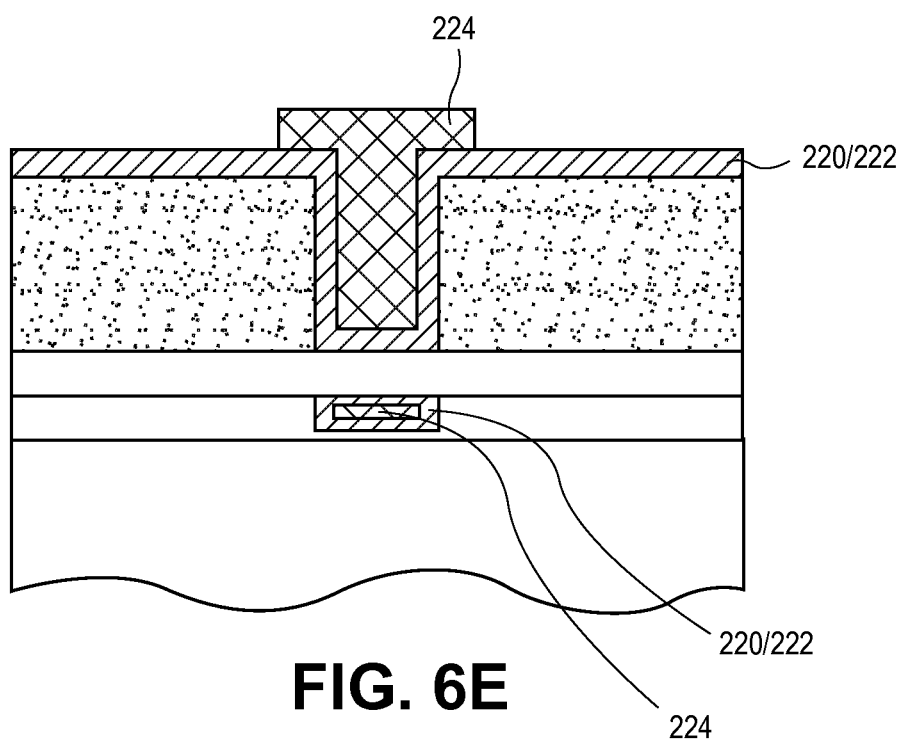

Then, referring to FIG. 6E, a gate electrode 224 is formed on the dual dielectric stack 220/222.

Referring again to FIG. 6E, the trench 612 may be formed as a relatively wide trench or a relatively narrow trench, as was described in association with FIGS. 2 and 3. The process flow depicted in FIGS. 6A-6E generally represents fabrication of a narrow trench and a specific dual dielectric stack formed therein. In another embodiment, a wide trench may be formed and then completely filled with a first dielectric layer of the dual gate stack. The first dielectric layer may then be patterned and a second dielectric layer formed thereon.

Thus, one or more embodiments described herein are targeted at III-V material active region arrangements integrated with dual gate dielectric stacks. Although described above with respect to benefits for non-planar and gate-all-around devices, benefits may also be achieved for planar devices without gate wrap-around features. Thus, such arrangements may be included to form III-V material-based transistors such as planar devices, fin or tri-gate based devices, and gate all around devices, including nanowire-based devices. Embodiments described herein may be effective for junction isolation in metal-oxide-semiconductor field effect transistors (MOSFETs). It is to be understood that formation of materials such as the III-V material layers described herein may be performed by techniques such as, but not limited to, chemical vapor deposition (CVD) or molecular beam epitaxy (MBE), or other like processes.

Figure 7:
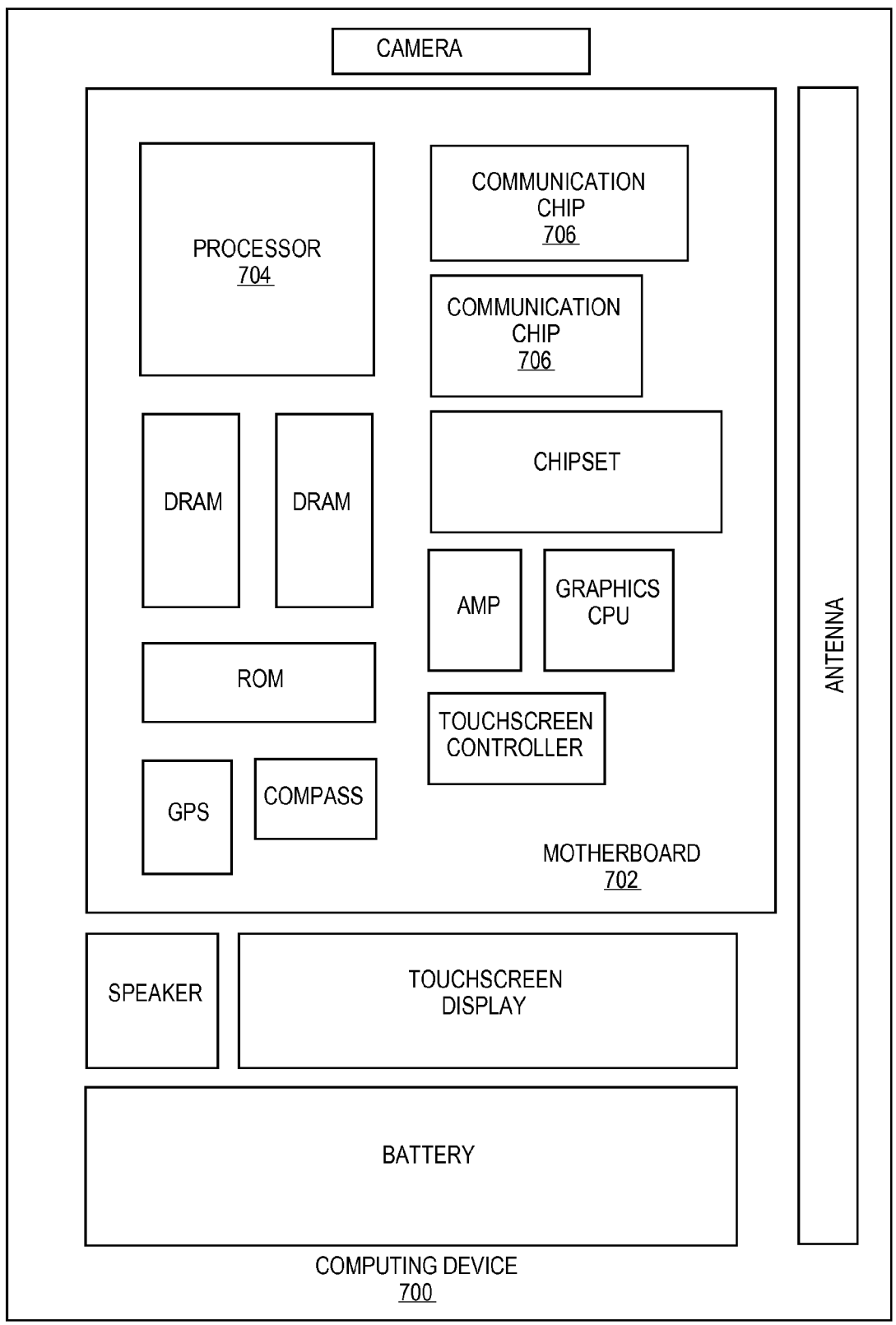
FIG. 7 illustrates a computing device in accordance with one implementation of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as MOS-FET transistors built in accordance with implementations of the invention.

In further implementations, another component housed within the computing device 700 may contain an integrated circuit die that includes one or more devices, such as MOS-FET transistors built in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Thus, embodiments of the present invention include non-planar semiconductor devices having group III-V material active regions with multi-dielectric gate stacks.

In an embodiment, a semiconductor device includes a hetero-structure disposed above a substrate. The hetero-structure includes a three-dimensional group III-V material body with a channel region. A source and drain material region is disposed above the three-dimensional group III-V material body. A trench is disposed in the source and drain material region separating a source region from a drain region, and exposing at least a portion of the channel region. A gate stack is disposed in the trench and on the exposed portion of the channel region. The gate stack includes a first dielectric layer conformal with the trench and disposed on outer portions, but not an inner portion, of the channel region. A second, different, dielectric layer is conformal with the first dielectric layer and is disposed on the inner portion of the channel region. A gate electrode is disposed on the second dielectric layer.

In one embodiment, the second dielectric layer has a higher dielectric constant than the first dielectric layer.

In one embodiment, the second dielectric layer has a dielectric constant greater than approximately 8 and the first dielectric layer has a dielectric constant approximately in the range of 4-8.

In one embodiment, the second dielectric layer is composed of a material such as, but not limited to, tantalum silicon oxide ($TaSiO_x$), aluminum oxide ($AlO_x$), hafnium oxide ($HfO_2$), zirconium oxide ($ZrO_2$), or lanthanum oxide ($La_2O_3$), and the first dielectric layer is composed of a material such as, but not limited to, aluminum silicate ($AlSiO_x$), silicon oxynitride (SiON), silicon dioxide ($SiO_2$) or silicon nitride ($Si_3N_4$).

In one embodiment, the first dielectric layer has a thickness approximately in the range of 2-15 nanometers, and the second dielectric layer has a thickness approximately in the range of 0.5-3 nanometers.

In one embodiment, the hetero-structure further includes a top barrier layer disposed between the source and drain material region and the three-dimensional group III-V material body. The trench is also disposed in the top barrier layer.

In one embodiment, the hetero-structure further includes a bottom barrier layer disposed between the substrate and the three-dimensional group III-V material body.

In one embodiment, the trench is also partially disposed in the bottom barrier layer, completely exposing the channel region. The gate stack completely surrounds the channel region.

In an embodiment, a semiconductor device includes a vertical arrangement of a plurality of group III-V material nanowires disposed above a substrate. A gate stack is disposed on and completely surrounds channel regions of each of the group III-V material nanowires. The gate stack includes a first dielectric layer disposed on outer portions, but not an inner portion, of each of the channel regions. A second, different, dielectric layer is conformal with the first dielectric layer and disposed on the inner portion of each of the channel regions. A gate electrode is disposed on the second dielectric layer. Source and drain regions surround portions of each of the group III-V material nanowires, on either side of the gate stack.

In one embodiment, the semiconductor structure further includes a top barrier layer disposed between the source and drain regions and each of the group III-V material nanowires.

In one embodiment, the semiconductor structure further includes a bottom barrier layer disposed between the substrate and the bottom-most group III-V material nanowire. A bottom portion of the gate stack is disposed on the bottom barrier layer.

In one embodiment, the second dielectric layer has a higher dielectric constant than the first dielectric layer.

In one embodiment, the second dielectric layer has a dielectric constant greater than approximately 8 and the first dielectric layer has a dielectric constant approximately in the range of 4-8.

In one embodiment, the second dielectric layer is composed of a material such as, but not limited to, tantalum silicon oxide ($TaSiO_x$), aluminum oxide ($AlO_x$), hafnium oxide ($HfO_2$), zirconium oxide ($ZrO_2$), or lanthanum oxide ($La_2O_3$), and the first dielectric layer is composed of a material such as, but not limited to, aluminum silicate ($AlSiO_x$), silicon oxynitride (SiON), silicon dioxide ($SiO_2$) or silicon nitride ($Si_3N_4$).

In one embodiment, the first dielectric layer has a thickness approximately in the range of 2-15 nanometers, and the second dielectric layer has a thickness approximately in the range of 0.5-3 nanometers.

In an embodiment, a semiconductor device includes a hetero-structure disposed above a substrate. The hetero-structure includes a three-dimensional group III-V material body with a channel region. A source and drain material region is disposed above the three-dimensional group III-V material body. A trench is disposed in the source and drain material region separating a source region from a drain region, and exposing at least a portion of the channel region. A gate stack is disposed in the trench and on the exposed portion of the channel region. The gate stack includes a first dielectric layer conformal with the trench and disposed on the exposed portion of the channel region. A second, different, dielectric layer is conformal with and disposed on the first dielectric layer, but not on the channel region. A gate electrode is disposed on the second dielectric layer.

In one embodiment, the second dielectric layer has a higher dielectric constant than the first dielectric layer.

In one embodiment, the second dielectric layer has a dielectric constant greater than approximately 8 and the first dielectric layer has a dielectric constant approximately in the range of 4-8.

In one embodiment, the second dielectric layer is composed of a material such as, but not limited to, tantalum silicon oxide ($TaSiO_x$), aluminum oxide ($AlO_x$), hafnium oxide ($HfO_2$), zirconium oxide ($ZrO_2$), or lanthanum oxide ($La_2O_3$), and the first dielectric layer is composed of a material such as, but not limited to, aluminum silicate ($AlSiO_x$), silicon oxynitride (SiON), silicon dioxide ($SiO_2$) or silicon nitride ($Si_3N_4$).

In one embodiment, the first dielectric layer has a thickness approximately in the range of 0.3-2 nanometers, and the second dielectric layer has a thickness approximately in the range of 0.5-3 nanometers.

In one embodiment, the hetero-structure further includes a top barrier layer disposed between the source and drain material region and the three-dimensional group III-V material body. The trench is also disposed in the top barrier layer.

In one embodiment, the hetero-structure further includes a bottom barrier layer disposed between the substrate and the three-dimensional group III-V material body.

In one embodiment, the trench is also partially disposed in the bottom barrier layer, completely exposing the channel region. The gate stack completely surrounds the channel region.

In an embodiment, a semiconductor device includes a vertical arrangement of a plurality of group III-V material nanowires disposed above a substrate. A gate stack is disposed on and completely surrounds channel regions of each of the group III-V material nanowires. The gate stack includes a first dielectric layer disposed on each of the channel regions. A second, different, dielectric layer is conformal with the first dielectric layer and is disposed on the first dielectric layer, but not on each of the channel regions. A gate electrode is disposed on the second dielectric layer. Source and drain regions surround portions of each of the group III-V material nanowires, on either side of the gate stack.

In one embodiment, the semiconductor structure further includes a top barrier layer disposed between the source and drain regions and each of the group III-V material nanowires.

In one embodiment, the semiconductor structure further includes a bottom barrier layer disposed between the substrate and the bottom-most group III-V material nanowire. A bottom portion of the gate stack is disposed on the bottom barrier layer.

In one embodiment, the second dielectric layer has a higher dielectric constant than the first dielectric layer.

In one embodiment, the second dielectric layer has a dielectric constant greater than approximately 8 and the first dielectric layer has a dielectric constant approximately in the range of 4-8.

In one embodiment, the second dielectric layer is composed of a material such as, but not limited to, tantalum silicon oxide ($TaSiO_x$), aluminum oxide ($AlO_x$), hafnium oxide ($HfO_2$), zirconium oxide ($ZrO_2$), or lanthanum oxide ($La_2O_3$), and the first dielectric layer is composed of a material such as, but not limited to, aluminum silicate ($AlSiO_x$), silicon oxynitride (SiON), silicon dioxide ($SiO_2$) or silicon nitride ($Si_3N_4$).

In one embodiment, the first dielectric layer has a thickness approximately in the range of 0.3-2 nanometers, and the second dielectric layer has a thickness approximately in the range of 0.5-3 nanometers.

What is claimed is:

1. A semiconductor device, comprising:
   a semiconductor substrate comprising a first semiconductor material;
   a second layer above the semiconductor substrate, the second layer comprising a second material different from the first semiconductor material;
   a nanowire above the second layer, the nanowire comprising a third material different than the second material, the nanowire having a channel region;
   a source region to a first side of the channel region and having a top, the source region top being above a top of the nanowire;
   a drain region to a second side of the channel region, the second side of the channel region being opposite the first side, the drain region having a top, the drain region top being above the top of the nanowire;
   a first gate dielectric layer around the channel region of the nanowire;
   a second gate dielectric layer around the channel region of the nanowire, the second gate dielectric layer being on the first gate dielectric layer and separated from the channel region of the nanowire by the first gate dielectric layer, the second gate dielectric layer having a higher dielectric constant than the first gate dielectric layer;
   a gate electrode around the channel region of the nanowire, the gate electrode being separated from the channel region of the nanowire by both the first gate dielectric layer and the second gate dielectric layer; and
   wherein a portion of the first gate dielectric layer on an underside of the channel region of the nanowire extends below a top surface of the second layer.

2. The device of claim 1, wherein the first gate dielectric layer completely surrounds the nanowire in a first cross section taken normal to a line extending from the source region to the drain region, and the first gate dielectric layer does not completely surround the nanowire in a second cross section taken through the nanowire and parallel with a top surface of the substrate.

3. The device of claim 2, wherein a perimeter of the nanowire in the first cross section has a non-circular shape.

4. The device of claim 1, wherein the second dielectric layer has a dielectric constant greater than 8 and the first dielectric layer has a dielectric constant of 7 or less.

5. The device of claim 4, wherein the second gate dielectric layer comprises a material selected from the group consisting of tantalum silicon oxide ($TaSiO_x$), aluminum oxide ($AlO_x$), hafnium oxide ($HfO_2$), zirconium oxide ($ZrO_2$), and lanthanum oxide ($La_2O_3$), and the first gate dielectric layer comprises a material selected from the group consisting of aluminum silicate ($AlSiO_x$), silicon oxynitride (SiON), silicon dioxide ($SiO_2$) and silicon nitride ($Si_3N_4$).

6. The device of claim 4, wherein the first gate dielectric layer has a thickness between 2 and 15 nanometers, inclusive, and the second gate dielectric layer has a thickness between 0.5-3 nanometers, inclusive.

7. The device of claim 1, wherein the third material of the nanowire comprises an element from group III of the periodic table and further comprises an element from group V of the periodic table.

8. The device of claim 7, wherein the third material comprises $In_xAs_{1-x}$.

9. The device of claim 7, wherein the third material comprises $In_xSb_{1-x}$.

10. The device of claim 1, wherein a portion of the second gate dielectric layer below the underside of the channel region of the nanowire extends below the top surface of the second layer and a portion of the gate electrode below the underside of the channel region of the nanowire extends below the top surface of the second layer.

11. The device of claim 1, wherein the nanowire has a height and a width, and the height is approximately the same as the width.

12. The device of claim 1, further comprising a third layer above the nanowire and below the source and the drain.

13. A semiconductor device, comprising:
a semiconductor substrate comprising a first semiconductor material;
isolation regions on portions of the substrate but not completely covering the substrate;
a substrate extension region where a portion of the substrate not covered by an isolation region extends up past a bottom surface of the isolation region;
a second layer at least partially above the substrate extension region of the semiconductor substrate, the second layer having at least a portion above the bottom surface of the isolation region and below a top surface of the isolation region, the second layer comprising a second material different from the first semiconductor material;
a source region above the second layer, the source region having a top;
a drain region above the second layer, the drain region having a top, the drain region being laterally spaced from the source region;
a channel material region above the second layer, the channel material region having a length measured along a first axis that extends from the source region to the drain region, the length of the channel material region being great enough to span at least most of a lateral distance between the source region and the drain region, the channel material region having a height measured along a second axis extending up from the substrate, the channel material region having a width measured along a third axis substantially orthogonal to the first axis and the second axis, the length being greater than the height and being greater than the width, the channel material region comprising a third material different than the second material, the channel material region having a channel region, the channel material region having a top, the top of the channel material region being below the top of the source region and being below the top of the drain region;
a first gate dielectric layer around the channel region of the channel material region;
a second gate dielectric layer around the channel region of the channel material region, the second gate dielectric layer being on the first gate dielectric layer and separated from the channel region of the channel material region by the first gate dielectric layer, the second gate dielectric layer having a higher dielectric constant than the first gate dielectric layer;
a gate electrode around the channel region of the channel material region, the gate electrode being separated from the channel region of the channel material region by both the first gate dielectric layer and the second gate dielectric layer; and wherein a portion of the first gate dielectric layer extends below a bottom of the channel region of the channel material region and extends below a top surface of the second layer, a portion of the second gate dielectric layer extends below the bottom of the channel region of the channel material region and extends below the top surface of the second layer, and a portion of the gate electrode extends below the bottom of the channel region of the channel material region and extends below the top surface of the second layer.

14. The device of claim 13, wherein the channel material region comprises a group III-V material.

15. The device of claim 14, wherein the third material comprises a material selected from the group consisting of $In_xAs_{1-x}$ and $In_xSb_{1-x}$.

16. The device of claim 13, wherein the first gate dielectric layer completely surrounds the channel material region in a first cross section taken normal to a line extending from the source region to the drain region, and the first gate dielectric layer does not completely surround the channel material region in a second cross section taken through the channel material region and parallel with a top surface of the substrate.

17. The device of claim 13, wherein the second gate dielectric layer comprises a material selected from the group consisting of tantalum silicon oxide (TaSiOx), aluminum oxide (AlOx), hafnium oxide (HfO2), zirconium oxide (ZrO2), and lanthanum oxide (La2O3), and the first gate dielectric layer comprises a material selected from the group consisting of aluminum silicate (AlSiOx), silicon oxynitride (SiON), silicon dioxide (SiO2) and silicon nitride (Si3N4).

18. A semiconductor device, comprising:
a vertical arrangement of a plurality of group III-V material nanowires disposed above a substrate;
a gate stack disposed on and completely surrounding channel regions of each of the group III-V material nanowires, the gate stack comprising:
a first dielectric layer disposed on outer portions, but not an inner portion, of each of the channel regions;
a second, different, dielectric layer conformal with the first dielectric layer and disposed on the inner portion of each of the channel regions; and
a gate electrode disposed on the second dielectric layer;
a semiconductor layer disposed between the substrate and the bottom-most group III-V material nanowire, wherein a bottom portion of the gate stack is disposed on the semiconductor layer; and
source and drain regions disposed in or on each of the group III-V material nanowires, on either side of the gate stack.

19. The semiconductor device of claim 18, wherein the second dielectric layer has a higher dielectric constant than the first dielectric layer.

20. The semiconductor device of claim 19, wherein the second dielectric layer has a dielectric constant greater than approximately 8 and the first dielectric layer has a dielectric constant approximately in the range of 4-8.

21. The semiconductor device of claim 19, wherein the second dielectric layer comprises a material selected from the group consisting of tantalum silicon oxide (TaSiOx), aluminum oxide (AlOx), hafnium oxide (HfO2), zirconium oxide (ZrO2), and lanthanum oxide (La2O3), and the first dielectric layer comprises a material selected from the group consisting of aluminum silicate (AlSiOx), silicon oxynitride (SiON), silicon dioxide (SiO2) and silicon nitride (Si3N4).

22. The semiconductor structure of claim 18, wherein the first dielectric layer has a thickness approximately in the range of 2-15 nanometers, and the second dielectric layer has a thickness approximately in the range of 0.5-3 nanometers.

* * * * *